United States Patent [19]
Soneda et al.

[11] Patent Number: 5,592,414
[45] Date of Patent: Jan. 7, 1997

[54] MEMORY CELL CIRCUIT INDEPENDENTLY CONTROLLED IN WRITING AND READING

[75] Inventors: Mitsuo Soneda; Akihiko Hashiguchi, both of Kanagawa, Japan

[73] Assignee: Sony Corporation, Japan

[21] Appl. No.: 547,784

[22] Filed: Oct. 25, 1995

[30] Foreign Application Priority Data

Oct. 28, 1994 [JP] Japan .................................... 6-265890

[51] Int. Cl.⁶ .................................................. G11C 11/34
[52] U.S. Cl. .......................... 365/154; 365/156; 365/149; 365/189.01
[58] Field of Search ..................................... 365/154, 156, 365/189.01, 149

[56] References Cited

U.S. PATENT DOCUMENTS

| | | | |
|---|---|---|---|
| 5,060,192 | 10/1991 | Young et al. | 365/156 |
| 5,325,338 | 6/1994 | Runaldue et al. | 365/156 |
| 5,414,657 | 5/1995 | Okimura | 365/156 |
| 5,469,380 | 11/1995 | Iio | 365/154 |

*Primary Examiner*—David C. Nelms
*Assistant Examiner*—Vu A. Le
*Attorney, Agent, or Firm*—Ronald P. Kananen

[57] ABSTRACT

A memory cell circuit which enables reduction of the leak current between a bit line and a memory cell and enables realization of a high speed reading operation and writing operation, wherein a write only circuit and a read only circuit are constructed by a drive transistor and a select transistor, the drive transistor comprising an enhancement type transistor with a threshold voltage set lower than the threshold voltage of the select transistor.

3 Claims, 7 Drawing Sheets

FIG. 7

MEMORY CELL CIRCUIT INDEPENDENTLY CONTROLLED IN WRITING AND READING

BACKGROUND OF THE INVENTION

1. Field of the Invention

The present invention relates to a memory cell circuit provided with independent select control lines and bit lines for output for use for writing and reading operations.

2. Description of the Related Art

Figure 1:
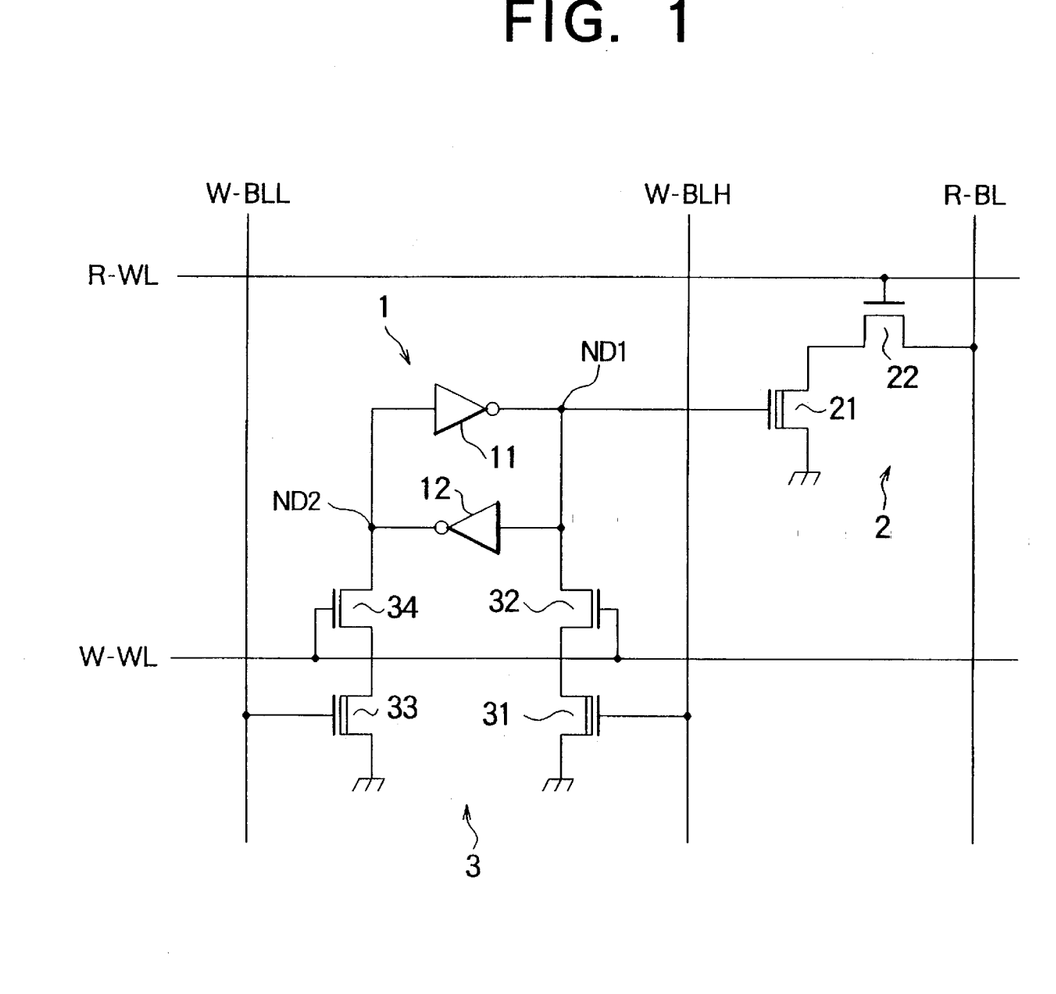
FIG. 1 is a circuit diagram of an example of the configuration of a conventional memory cell circuit.

FIG. 1 is a circuit diagram of an example of the configuration of a memory cell circuit as a related art.

As shown in FIG. 1, the memory cell circuit is configured as a static random access memory (SRAM) cell 1 comprised of an inverter 11 and an inverter 12 with inputs and outputs connected cross-wise, a read only circuit 2 comprised of an n-channel (N) metal oxide semiconductor (MOS) transistor for driving 21 and an NMOS transistor for access 22, the transistors 21 and 22 being connected in series between a bit line for reading R-BL and a ground line ( reference voltage source ), and a write only circuit 3 comprised of an NMOS transistor for writing 31 and an NMOS transistor for selecting 32, the transistors 31 and 32 being connected in series between a first memory node ND1 of the SRAM cell 1 and the ground line, and an NMOS transistor for writing 33 and an NMOS transistor for selecting 34, the transistors 33 and 34 being connected in series between a second memory node ND2 of the SRAM cell 1 and the ground line.

A gate electrode of the NMOS transistor for driving 21 of the read only circuit 2 is connected to the first memory node ND1 as the output node of the SRAM cell 1, and a gate electrode of the NMOS transistor for access 22 is connected to a word line for reading R-WL. A gate electrode of the NMOS transistor for writing 31 of the write only circuit 3 is connected to a bit line for writing high level data W-BLH, a gate electrode of the NMOS transistor 33 is connected to a bit line for writing low level data W-BLL, and gate electrodes of the NMOS transistors for selecting 32 and 34 are connected to a word line for writing W-WL.

In this configuration, the word line for writing high level data W-BLH and the word line for writing low level data W-BLL are held at the low level at times other than a writing operation.

In this state, for example, when high level data is written into the SRAM cell 1, the level of the bit line for writing high level data W-BLH is switched from the low level to the high level. Due to this, the NMOS transistor 31 switches from the non-conductive state to the conductive state. Also, at this time, the level of the word line for writing W-WL is set to the high level. As a result, the NMOS transistors for selecting 32 and 34 switch from the non-conductive state to the conductive state.

Due to this, the level of the first memory node (the output node) ND1 shifts to the ground level. As a result, the level of the second memory node ND2 is held at the high level stably through the inverter 12.

Also, when the low level data is written into the SRAM cell 1, the level of the bit line for writing low level data W-BLL is switched from the low level to the high level. Due to this, the NMOS transistor for writing 33 switches from the non-conductive state to the conductive state. Also, at this time, the level of the word line for writing W-WL is set to the high level. As a result, the NMOS transistors for selecting 32 and 34 switch from the non-conductive state to the conductive state.

Due to this, the level of the second memory node ND2 shifts to the ground level, and the level of the second memory node ND2 is held at the low level stably.

When the data written in the SRAM cell 1 is read out, the level of the word line for reading R-WL is set to the high level. Due to this, the NMOS transistor for access 22 of the read only circuit 2 is held in the conductive state. As a result, the data is read out to the bit line for reading R-BL precharged to a predetermined level through the NMOS transistor for driving 21.

For example, when the low level data is stored in the SRAM cell 1, since the output node (the first memory node) ND1 is held at the high level, the NMOS transistor for driving 21 of the read only circuit 2 switches from the non-conductive state to the conductive state. In a reading operation, since the NMOS transistor for access 22 is in the conductive state too, the level of the bit line for reading W-BL, precharged to a predetermined level, shifts to the ground level. As a result, the low level data is read out.

However, in the above-mentioned conventional memory cell circuit, the reading time is shortened, so it is necessary to enlarge the channel width W21 of the NMOS transistor for driving 21 of the read only circuit 2.

Enlarging the channel width W21 of the NMOS transistor for driving 21 increases the capacity of the output node ND1. As a result, the NMOS transistors 31 to 34 used in the write only circuit 3 must be enlarged in their channel widths in order to increase the drive capacities of the NMOS transistors 31 to 34.

As a result, the conventional memory cell circuit suffers from the following problems. Namely, since the capacities of the word line for writing W-WL and the bit lines for writing W-BLH and W-BLL increase, the speed of writing operation decreases. Also since the memory cells increase in size, the cost of the circuit increases, and the power consumption increases.

SUMMARY OF THE INVENTION

The present invention has as its object to provide a memory cell circuit which can reduce the channel width of the transistor for driving of the read only circuit, increase the speed of the writing operation, and prevent the memory size from increasing.

According to the present invention, there is provided a memory cell circuit comprising a write only circuit, at least one read only circuit, and a latch circuit having an output node. The read only circuit comprises a first insulator gate field-effect transistor for driving and a second insulator gate field-effect transistor for selecting. The first and second transistors are connected in series between a bit line for reading and a reference voltage source. A gate electrode of the first insulator gate field-effect transistor is connected to the output node of the latch circuit, and a gate electrode of the second insulator gate field-effect transistor is connected to an address select line for reading. The first insulator gate field-effect transistor comprises an enhancement type transistor with a threshold voltage set lower than the threshold voltage of the second insulator gate field-effect transistor.

Preferably, the latch circuit comprises a pair of inverters with inputs and outputs connected cross-wise and having a pair of memory node s in which one of these connected to the output node; the write only circuit comprises a third insulator gate field-effect transistor with a gate electrode connected to a bit line for writing and a fourth insulator gate field-effect transistor with a gate electrode connected to an address control line, the third and fourth transistors being connected in series between each of the pair of the memory node s and each of a pair of bit lines for writing; the third insulator gate field-effect transistor comprises an enhancement type transistor with a threshold voltage set lower than the threshold voltage of the fourth insulator gate field-effect transistor.

There may be a plurality of read only circuits.

BRIEF DESCRIPTIONS OF THE DRAWINGS

These and other objects and features of the present invention will become more apparent from the following description of the preferred embodiments made with reference to the drawings, in which.

DESCRIPTION OF THE PREFERRED EMBODIMENTS

The memory cell circuit of the present invention is provided with a write only circuit and a read only circuit comprised of a metal insulator semiconductor (MIS) transistor for driving and a MIS transistor for access, these transistors for driving and access being connected in series between a bit line for reading and a reference voltage source, a gate electrode of the MIS transistor for driving connected to the output node of the memory cell, a gate electrode of the MIS transistor for access connected to the word line for reading, and the MIS transistor comprised of an enhancement type transistor with a threshold voltage set to lower than the threshold voltage of the MIS transistor for access.

The memory cell circuit may have a static memory cell having a first memory node and a second memory node comprised of two inverters connected cross-wise, one of the memory nodes connected to a gate electrode of the MIS transistor for driving of the read only circuit as the output node, the write only circuit comprising a first MIS transistor for writing and a first MIS transistor for selecting, the first transistors being connected in series between the first memory node and the reference voltage source, and a second MIS transistor for writing and a second MIS transistor for selecting, the second transistors being connected in series between the second memory node and the reference voltage source, a gate electrode of the first MIS transistor for writing connected to a first bit line for writing, a gate electrode of the second MIS transistor for writing connected to a second bit line for writing, gate electrodes of the first and the second MIS transistors for selecting connected to a word line for writing, and the first and the second MIS transistors for writing comprising enhancement type transistors with threshold voltages set to lower than the threshold voltage of the first and the second MIS transistors for selecting.

The output node of the memory cell may be connected to a plurality of the read only circuits.

The plurality of the read only circuits may have a common MIS transistor for driving and may have the MIS transistors for access connected to the bit line for reading and the word line for writing, respectively.

According to the memory cell circuit of the present invention, the threshold voltage of the MIS transistor for driving is set lower than the threshold voltage of the MIS transistor for access, so it is possible to obtain a sufficient drive capacity. As a result, it is not necessary to enlarge the channel width of the MIS transistor for driving.

Accordingly, it is possible to prevent the capacity of the output of the memory cell from increasing, and the channel width of the transistor constructing the write only circuit may be still set to a small value.

As a result, it is possible to prevent the capacity of the word line for writing and the bit line for writing from increasing and prevent the speed of the writing operation from decreasing.

Further, in the write only circuit, the threshold voltage of the MIS transistor for writing is set lower than the standard threshold voltage of the MIS transistor, so it is possible to increase the speed of the writing operation.

Specific embodiments of the present invention will now be explained in detail with reference to the drawings.

Figure 2:
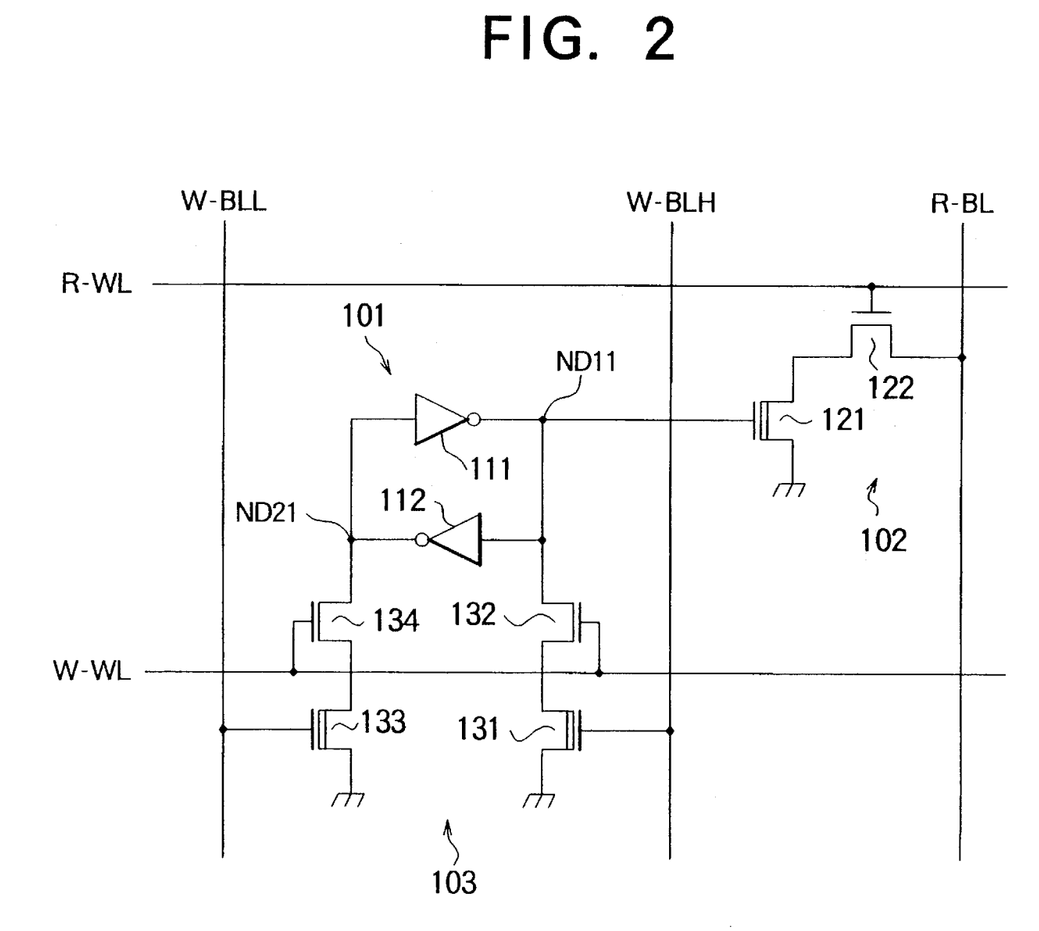
FIG. 2 is a circuit diagram of a first embodiment of a memory cell circuit according to the present invention.

FIG. 2 is a circuit diagram of a first embodiment of the memory cell circuit according to the present invention.

In FIG. 2, 101 represents a SRAM cell, 102 represents a read only circuit, 103 represents a write only circuit, R-BL represents a bit line for reading, R-WL represents a word line for reading, W-BLH represents a bit line for writing high level data, W-BLL represents a bit line for writing low level data, W-WL represents a word line for writing, ND11 represents a first memory node (an output node), and ND21 represents a second memory node.

The read only circuit 102 comprises an enhancement type NMOS transistor for driving 121 with a threshold voltage $V_{TH121}$, set to for example 0.2 V, which is lower than the threshold voltage $V_{TH}=0.6$ of the standard enhancement type NMOS transistor, and an enhancement type NMOS transistor 122 with a threshold voltage set to the standard threshold voltage $V_{TH}=0.6$ V.

A gate electrode of the NMOS transistor for driving 121 is connected to the output node ND11 of the SRAM cell 101, while a gate electrode of the NMOS transistor for access 122 is connected to the word line for reading R-WL.

The write only circuit 103 comprises an enhancement type NMOS transistor for writing 131 and an enhancement type NMOS transistor for selecting 132, the transistors 131 and 132 being connected in series between the first memory node ND11 and the ground line, and an enhancement type NMOS transistor for writing 133 and an enhancement type NMOS transistor for selecting 134, the transistors 133 and 134 being connected in series between the second memory node ND21 of the SRAM cell 101 and the ground line. The threshold voltage $V_{TH131}$ of the NMOS transistor for writing 131 and the threshold voltage $V_{TH133}$ of the NMOS transistor for writing are set to for example 0.2 V, which is lower than the threshold voltage $V_{TH}=0.6$ V of the standard enhancement type NMOS transistor, and the threshold voltages of the NMOS transistors for selecting 132 and 134 are set to the standard threshold voltage $V_{TH}=0.6$ V.

A gate electrode of the NMOS transistor for writing 131 of the write only circuit 103 is connected to the bit line for writing high level data W-BLH, a gate electrode of the NMOS transistor for writing 133 is connected to the bit line for writing low level data W-BLL, and gate electrodes of the NMOS transistors for selecting 132 and 134 are connected to the word line for writing W-WL.

As explained above, according to the present embodiment, the threshold voltage $V_{TH121}$ of the NMOS transistor for driving 121 of the read only circuit 102 is set lower than the standard threshold voltage $V_{TH122}$ of the NMOS transistor for access 122, so it is possible to increase the drive capacity of the NMOS transistor for access 121 and to shorten the reading time. The reason will be explained below.

In general, it is widely known that the maximum operating frequency is satisfied with the next relationship:

$$F_{max} \propto V_{cc} - V_{TH}$$

Figure 3:
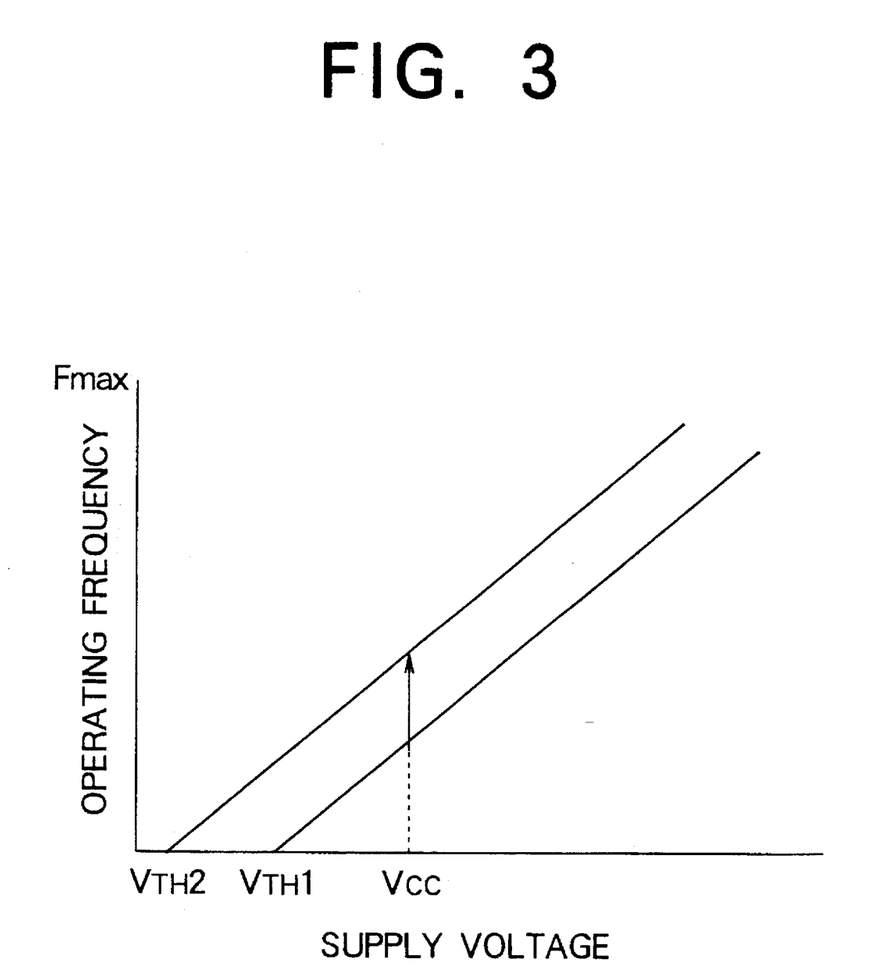
FIG. 3 is a view of explanation of the relationship between the threshold voltage and the operating frequency of a MOS transistor.

It will be understood by this relative formula and FIG. 3 that if the threshold voltage $V_{TH}$ is set lower, the operating frequency will increase, and precharged charge of the bit line for reading R-BL can be changed in a short time. Namely, it is possible to realize high speed operation.

The threshold voltage $V_{TH121}$ of the NMOS transistor for driving 121 is set lower in this way, so it is possible to obtain a sufficient drive capacity. As a result, it is not necessary to enlarge the channel width $W_{121a}$.

Accordingly, it is possible to prevent the capacity of the output node ND11 of the SRAM cell 101 from increasing, so the channel widths of the NMOS transistors 131, 132, 133, and 134 constructing the write only circuit 103 remain small.

As a result, it is possible to prevent the capacity of the word line for writing W-WL and the bit lines for writing W-BLH and W-BLL from increasing and prevent the speed of the writing operation from decreasing. Further, it is possible to prevent the memory size, the cost, and the power consumption from increasing.

Also, in the write only circuit of this embodiment, the threshold voltages $V_{TH131}$ and $V_{133}$ of the NMOS transistors for writing 131 and 133 are set lower than the standard threshold voltages thereof, so the speed of the writing operation increases.

Namely, in general, when the threshold voltage $V_{TH}$ of the MOS transistor is set lower, the leak current increases in the OFF state.

Concretely, if the threshold voltage $V_{TH}$ is reduced to 0.1 V, there is a problem that the leak current is will increase by one order of magnitude.

However, generally, the chance of being activated the word line connected anyone specific cell in a memory cell array is small (nearly zero as duty), so the normal level is "0 (low level)".

Accordingly, the leak current of the NMOS transistors 121, 131, and 133 with threshold voltages set lower is cut off by the NMOS transistors 122, 132, and 134 connected in series to the NMOS transistors 121, 131, and 133 respectively and set the threshold voltage to the standard level.

Further, the leak current of the NMOS transistor for driving 121 is too small for driving the bit line for reading R-BL in spite of the level of the word line for reading R-WL being set to high level, so no erroneous operation will happen in a reading operation.

Figure 4:
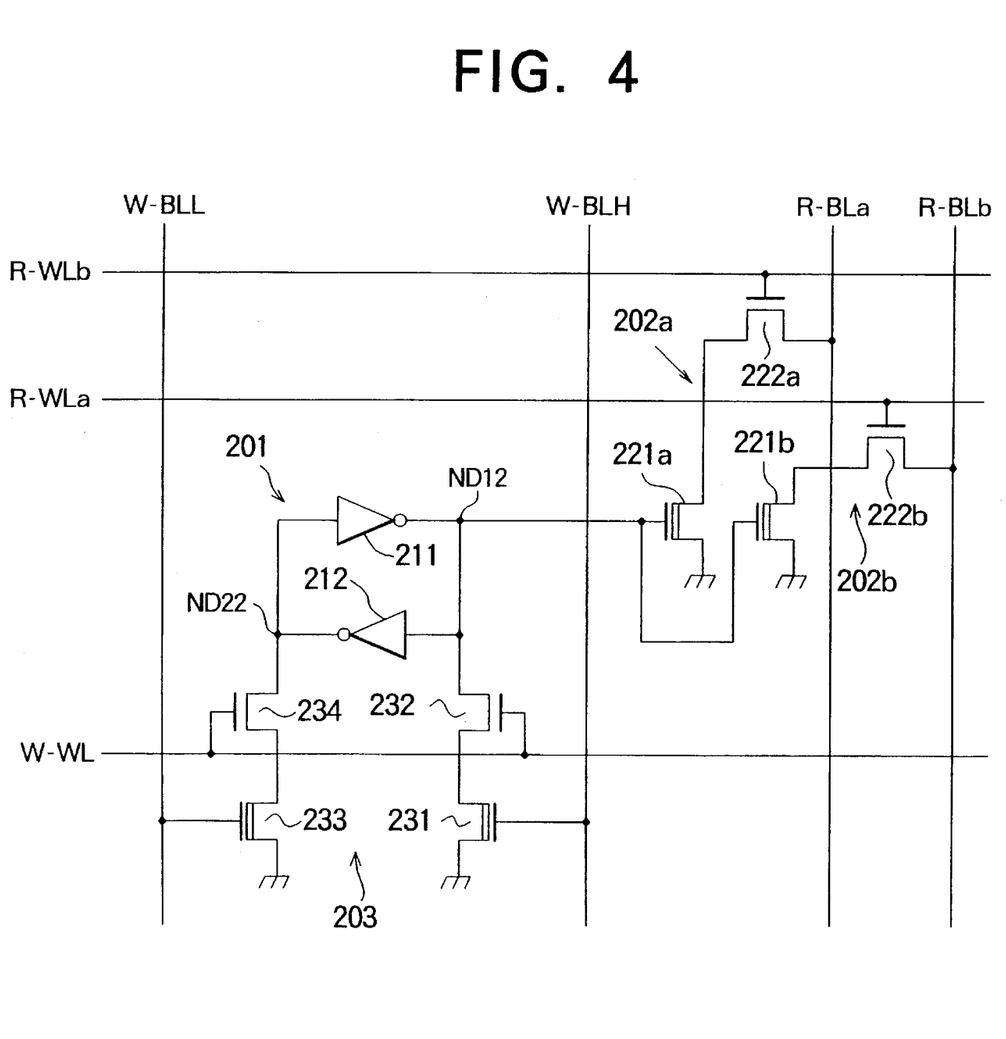
FIG. 4 is a circuit diagram of a second embodiment of a memory cell circuit according to the present invention.

FIG. 4 is a circuit diagram of a second embodiment of the memory cell circuit according to the present invention.

The differences of this embodiment with the first embodiment are that a plurality of the read only circuits (two circuits in this embodiment) are connected in parallel to the output node ND12 of the SRAM cell 201.

Namely, the memory cell circuit of the second embodiment comprises a write only system and two read only systems.

In this circuit, the gate electrodes of the NMOS transistors for driving 221a and 221b of the read only circuits 202a and 202b are connected to the output node ND12.

Further, the NMOS transistor for access 222a of the read only circuit 202a is connected to the bit line for reading R-BLa, while the gate electrode of the NMOS transistor 222a is connected to the word line for reading R-WLb. The NMOS transistor for access 222b of the read only circuit 202b is connected to the bit line for reading R-BLb and to the word line for reading R-WLa.

According to the second embodiment, similar effects can be obtained as with the above-mentioned first embodiment.

Figure 5:
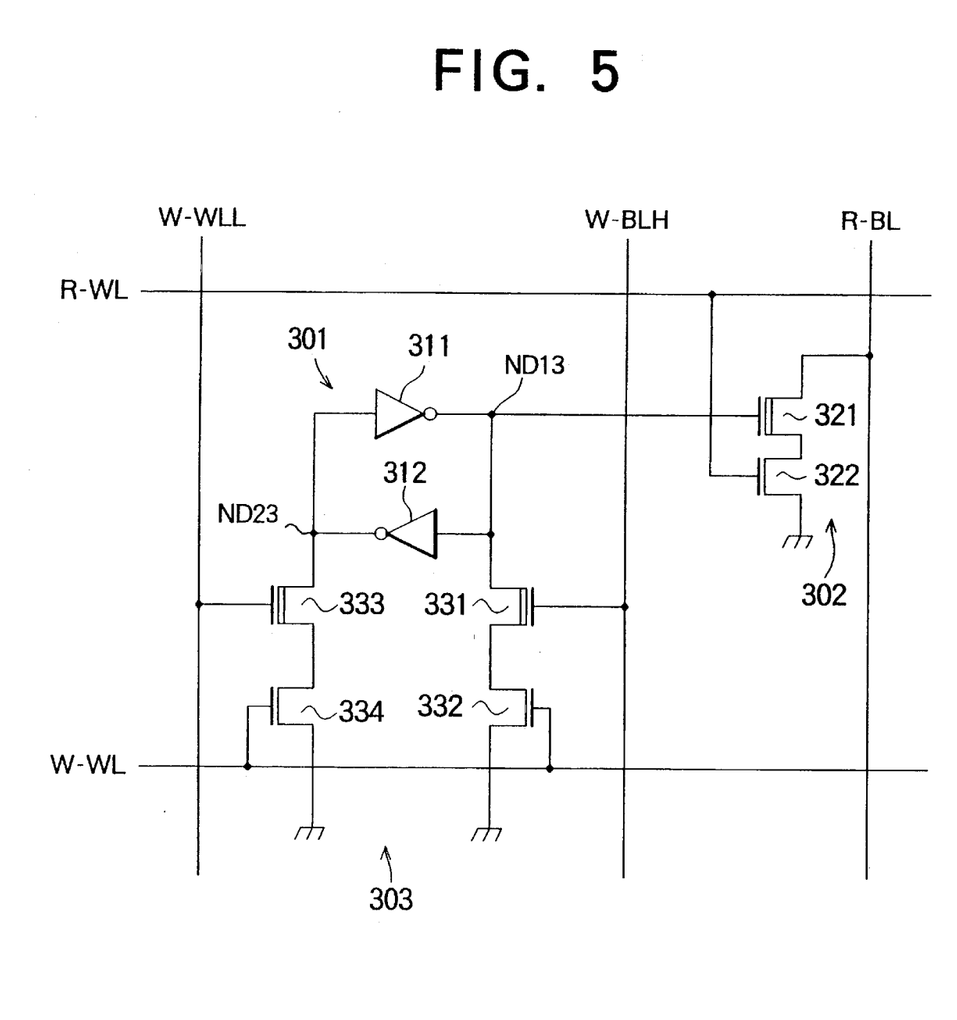
FIG. 5 is a circuit diagram of a third embodiment of a memory cell circuit according to the present invention.

FIG. 5 is a circuit diagram of a third embodiment of the memory cell circuit according to the present invention.

The differences of this third embodiment with the first embodiment are that the connecting positions of the NMOS transistor for driving 321 and the NMOS transistor for access 322, the transistors 321 and 322 being connected in series between the bit line for reading R-BL and the ground line, are reversed in the read only circuit 302.

Similarly, in the write only circuit 303, the connecting positions of the NMOS transistor for writing 331 and the NMOS transistor for selecting 332, the transistors 331 and 332 being connected in series between the first memory node ND13 and the ground line, are reversed, and the connecting positions of the NMOS transistor for writing 333 and the NMOS transistor for selecting 334, the transistors 333 and 334 being connected in series between the second memory node ND23 and the ground line, are reversed.

With this configuration too, similar effects can be obtained as with the above-mentioned first embodiment.

Figure 6:
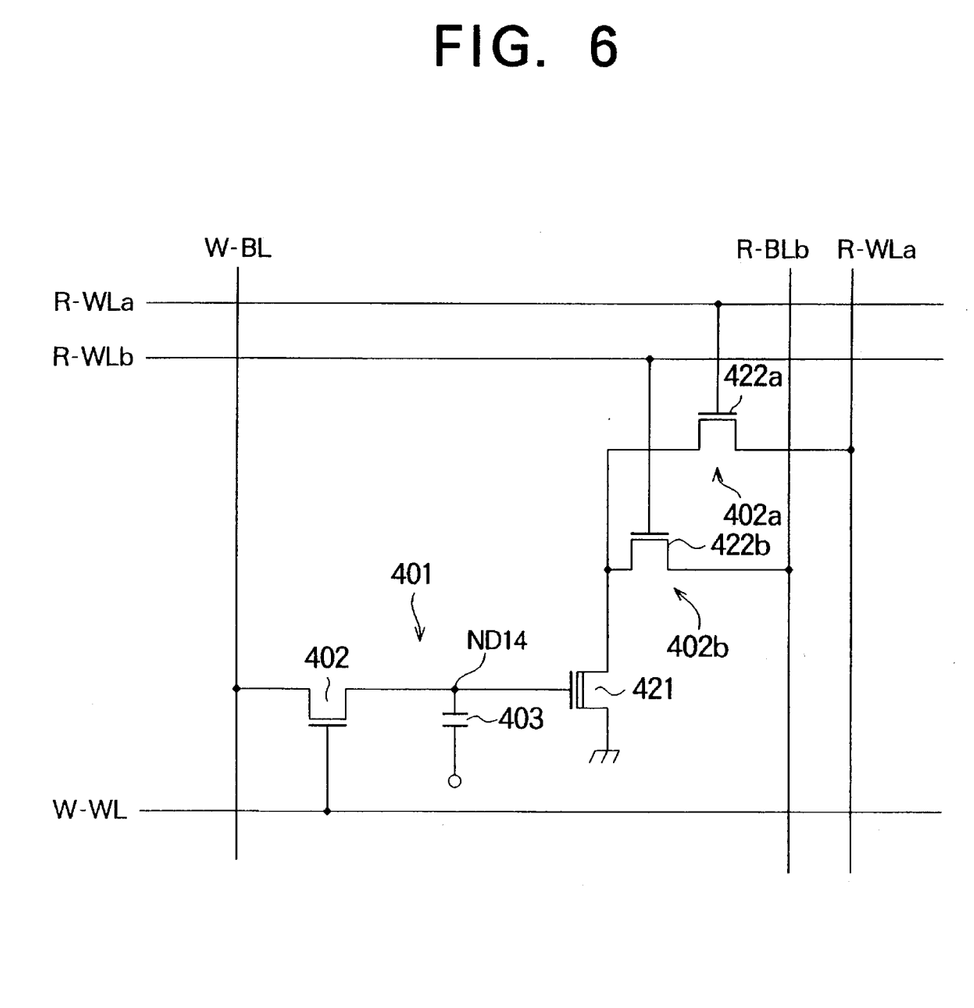
FIG. 6 is a circuit diagram of a fourth embodiment of a memory cell circuit according to the present invention.

FIG. 6 is a circuit diagram of a fourth embodiment of the memory cell circuit according to the present invention.

In this embodiment, the memory cell comprises a dynamic random access memory (DRAM) cell 401 which is provided with a NMOS transistor for addressing 402 and a storage capacitor 403. A memory node ND14 is connected to two read only circuit 402a and 402b in parallel.

Namely, one write system and two read systems are provided in the same way as with the above-mentioned second embodiment.

In this configuration, the NMOS transistor for driving 421 is used in common by two read only circuits 402a and 402b, and the NMOS transistors for access 422a and 422b are connected in parallel to the drain of the NMOS transistor for driving 421.

In the conventional DRAM, the word line is not charged, so the high level of the memory node ND14 shifts to $(V_{cc} - V_{TH})$. Namely, the drive capacity of the NMOS transistor for driving 421 of the conventional DRAM is not sufficient. In this fourth embodiment, however, it is possible to obtain a sufficient drive capacity.

Figure 7:
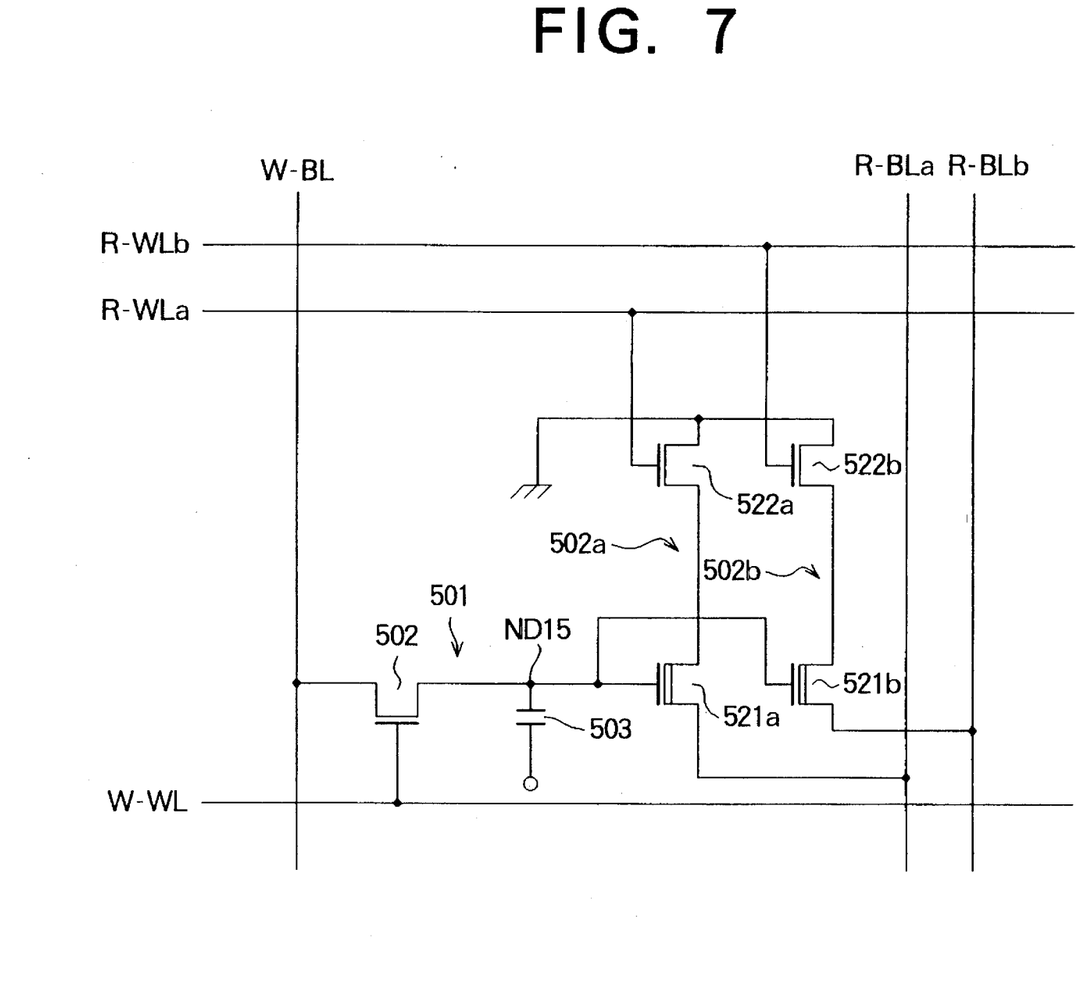
FIG. 7 is a circuit diagram of a fifth embodiment of a memory cell circuit according to the present invention.

FIG. 7 is a circuit diagram of a fifth embodiment of the memory cell circuit according to the present invention.

The differences of this fifth embodiment with the fourth embodiment are that instead of the NMOS transistor for driving being used in common by two read only circuits 502a and 502b, NMOS transistors 521a and 521b are provided respectively for the read only memories 502a and 502b in the same way as with the above-mentioned second embodiment. Also the connecting positions of the NMOS transistor for driving 521a and the NMOS transistor for access 522a, the transistors 521a and 522a being connected in series between the bit line for reading R-BLa and the ground line, are reversed, and the connecting positions of the NMOS transistor for driving 521b and the NMOS transistor for access 522b, the transistors 521b and 522b being connected in series between the bit line for reading R-BLb and the ground line, are reversed, in the same way as with the above-mentioned third embodiment.

With this configuration too, similar effects can be obtained as with the above-mentioned fourth embodiment.

Note that, in the above-mentioned embodiments, the explanation was made of the case where a NMOS transistor was provided for each of the circuits, but needless to say the present invention can be applied to circuits provide with p-channel MOS transistors.

Many widely different embodiments of the present invention may be constructed without departing from the spirit and scope the present invention, and it should be understood that the present invention is not restricted to the specific embodiments described above.

What is claimed is:

1. A memory cell circuit comprising a write only circuit, at least one read only circuit, and a latch circuit having an output node, in which said read only circuit comprises a first insulator gate field-effect transistor for driving and a second insulator gate field-effect transistor for selecting, said first and second transistors being connected in series between a bit line for reading and a reference voltage source, a gate electrode of said first insulator gate field-effect transistor being connected to said output node of said latch circuit, and a gate electrode of said second insulator gate field-effect transistor being connected to an address select line for reading, and said first insulator gate field-effect transistor comprising an enhancement type transistor with a threshold voltage set lower than the threshold voltage of said second insulator gate field-effect transistor.

2. A memory cell circuit according to claim 1, wherein said latch circuit comprises a pair of inverters with inputs and outputs connected cross-wise and having a pair of memory node s, one of which is connected to said output node of said latch circuit, wherein said write only circuit comprises a third insulator gate field-effect transistor with a gate electrode connected to a bit line for writing and a fourth insulator gate field-effect transistor with a gate electrode connected to an address control line, said third and fourth transistors being connected in series between each of the pair of the memory node s and each of a pair of bit lines for writing, and wherein said third insulator gate field-effect transistor comprises an enhancement type transistor with a threshold voltage set lower than the threshold voltage of said fourth insulator gate field-effect transistor.

3. A memory cell circuit according to claim 1, wherein said read only circuit comprises a plurality of read only circuits.

* * * * *